(12) United States Patent
Totten et al.

(10) Patent No.: US 12,713,571 B2
(45) Date of Patent: Aug. 18, 2026

(54) TWO PART EXTERNAL SHIELD FOR ELECTROMAGNETIC INTERFERENCE REDUCTION

(71) Applicant: STMICROELECTRONICS INTERNATIONAL N.V., Geneva (CH)

(72) Inventors: Jack Totten, Dunbar (GB); William Halliday, Edinburgh (GB)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 99 days.

(21) Appl. No.: 18/653,663

(22) Filed: May 2, 2024

(65) Prior Publication Data

US 2025/0344361 A1 Nov. 6, 2025

(51) Int. Cl.
*H05K 9/00* (2006.01)
*G01S 7/481* (2006.01)

(52) U.S. Cl.
CPC .......... *H05K 9/0049* (2013.01); *G01S 7/4813* (2013.01); *H05K 9/0032* (2013.01); *H05K 9/0064* (2013.01)

(58) Field of Classification Search
USPC ......................................... 361/799, 816, 818
See application file for complete search history.

(56) References Cited

U.S. PATENT DOCUMENTS

2007/0267734 A1 11/2007 Zhao et al.
2009/0273912 A1* 11/2009 Myers .................. H05K 9/0032 361/818
2012/0147573 A1* 6/2012 Lim ..................... H05K 9/0028 361/753
2012/0155854 A1* 6/2012 Huang .................. H10F 39/804 29/592.1
2018/0090407 A1 3/2018 Beaumier et al.
2019/0098804 A1 3/2019 Wang et al.
2021/0336360 A1 10/2021 Kolak et al.
2025/0287557 A1* 9/2025 Cheng ................. H05K 1/0218

FOREIGN PATENT DOCUMENTS

CN 206059759 U 3/2017
CN 213989317 U 8/2021
WO WO 2023/238471 A1 3/2023

* cited by examiner

*Primary Examiner* — Hung S. Bui
(74) *Attorney, Agent, or Firm* — Alston & Bird LLP

(57) ABSTRACT

A two-part external metal shield for electromagnetic interference reduction that reduces vulnerability of a shielded sensor is provided. An example electromagnetic shield for a sensor includes: a first portion defining a first part of an interfacing profile and one or more tabs; a second portion defining a second part of an interfacing profile; where the first portion and the second portion combine to form a cavity into which the sensor is received, where the one or more tabs extends into the cavity along a first axis, and where the first part of the interfacing profile is secured to the second part of the interfacing profile along a second axis perpendicular to the first axis.

20 Claims, 14 Drawing Sheets

200
220
210
242
200
220
210
240
230
230
240

B
B
360
360
300
300
375
370

B
B
300
340
300
380
340
375
370

B
B
300
300
380
375
340
370
330

TWO PART EXTERNAL SHIELD FOR ELECTROMAGNETIC INTERFERENCE REDUCTION

TECHNOLOGICAL FIELD

Example embodiments of the present disclosure relate generally to an external shield for electromagnetic interference reduction of a sensor, and more particularly, to a two-part external metal shield for electromagnetic interference reduction that reduces vulnerability of the shielded sensor.

BACKGROUND

Electronic devices, and particularly mobile devices, can perform a wide variety of functions and the computing power of such devices is ever-increasing. The compact form factor for mobile devices poses a challenge as space within the device for various components is limited. The sensors, display(s), cameras, communications interface, speakers, etc. all compete for space within a chassis that needs to be both small and durable. Some of these components may be sensitive to interference from other components within the device and may require shielding from such components. Shields, such as electromagnetic interference shielding can further increase the size of components and restrict space within a device.

The compact form factor, various components required to achieve the various functionalities of a device and their respective sizes lead to intricate packaging within the device with close-coupled components. This package arrangement results in complex assembly techniques that require accurate and repeatable handling. Components that are vulnerable to damage can be compromised during the handling process and may thus be a point of failure for the mobile device.

BRIEF SUMMARY

Various embodiments described herein relate to an external shield for electromagnetic interference reduction of a sensor, and more particularly, to a two-part external metal shield for electromagnetic interference reduction that reduces vulnerability of the shielded sensor.

In accordance with some embodiments of the present disclosure, an example method is provided. Embodiments provided herein include an electronic device including: a sensor; an electromagnetic shield defining a cavity within which is received the sensor; where the electromagnetic shield includes a first portion and a second portion, where the first portion includes one or more tabs extending into the cavity, where the first portion includes a first part of an interfacing profile, the second portion includes a second part of the interfacing profile, and where the first portion is secured to the second portion in response to the first part of the interfacing profile engaging with the second part of the interfacing profile.

According to some embodiments the sensor includes: a sensor substrate; a sensor cap attached to the sensor substrate; and at least one connecting tab defined on the substrate, wherein at least one recess defined within the sensor cap provides access to the at least one connecting tab, and wherein the one or more tabs engages the at least one connecting tab within the at least one recess. The sensor cap of some embodiments is attached to the sensor substrate using an adhesive, where the substrate includes at least one dam at least partially surrounding the at least one connecting tab, between the adhesive and the at least one connecting tab. According to some embodiments the first portion is installed onto the sensor along a first axis, substantially parallel to a plane defined by the substrate.

According to certain embodiments the second portion is installed onto the sensor along a second axis, orthogonal to the plane defined by the substrate. The second portion of the electromagnetic shield of some embodiments includes a securing tab extending into the cavity defined by the electromagnetic shield, where the securing tab is received into a recess in a top surface of the sensor cap. According to some embodiments the securing tab is secured within the cavity in the recess in the top surface of the sensor cap with a conductive adhesive. The first portion and second portion are, in some embodiments, formed of electrically conductive material and where the second portion is in electrical communication with the at least one connecting tab through the first portion. According to certain embodiments, a clearance between the electromagnetic shield and the sensor is around one hundred microns or less.

Embodiments provided herein include an electromagnetic shield for a sensor including: a first portion defining a first part of an interfacing profile and one or more tabs; a second portion defining a second part of an interfacing profile; where the first portion and the second portion combine to form a cavity into which the sensor is received, where the one or more tabs extends into the cavity along a first axis, and where the first part of the interfacing profile is secured to the second part of the interfacing profile along a second axis perpendicular to the first axis.

According to some embodiments the second portion further defines a securing portion extending into the cavity along the second axis. The first portion and the second portion are in some embodiments formed of conductive material, where the first portion is in electrical communication with the second portion through the interfacing profile. The first portion and the second portion are in some embodiments formed of metal. According to some embodiments the first portion defines a first aperture for a receiving element of a time-of-flight sensor and the second portion defines a second aperture for a transmitting element of the time-of-flight sensor.

Embodiments provided herein include a method of manufacturing a two-piece electromagnetic shield for a sensor including: forming a shield blank from sheet metal, where the shield blank is a single piece of metal defining a cavity, the shield blank having a top side and four walls attached to the top side; forming a securing tab in the top side, where the securing tab extends toward the cavity; form a tab in one of the four walls, where the tab extends toward the cavity; severing a first portion of the shield blank from a second portion of the shield blank along a cut line; and singulating the first portion from the second portion.

According to some embodiments the cut line extends across the top side of the shield blank following an interfacing profile path, forming a first part of an interfacing profile on the first portion and forming a second part of the interfacing profile on the second portion. The first portion of some embodiments is configured to be secured to the second portion after singulation in response to the first part of the interfacing profile engaging the second part of the interfacing profile. The method of some embodiments further includes trimming excess sheet metal from the four walls. The forming of the securing tab includes in some embodiments driving a punch into the top side of the shield blank. According to certain embodiments the forming of the shield blank from sheet metal includes a stamping process.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Figure 1:
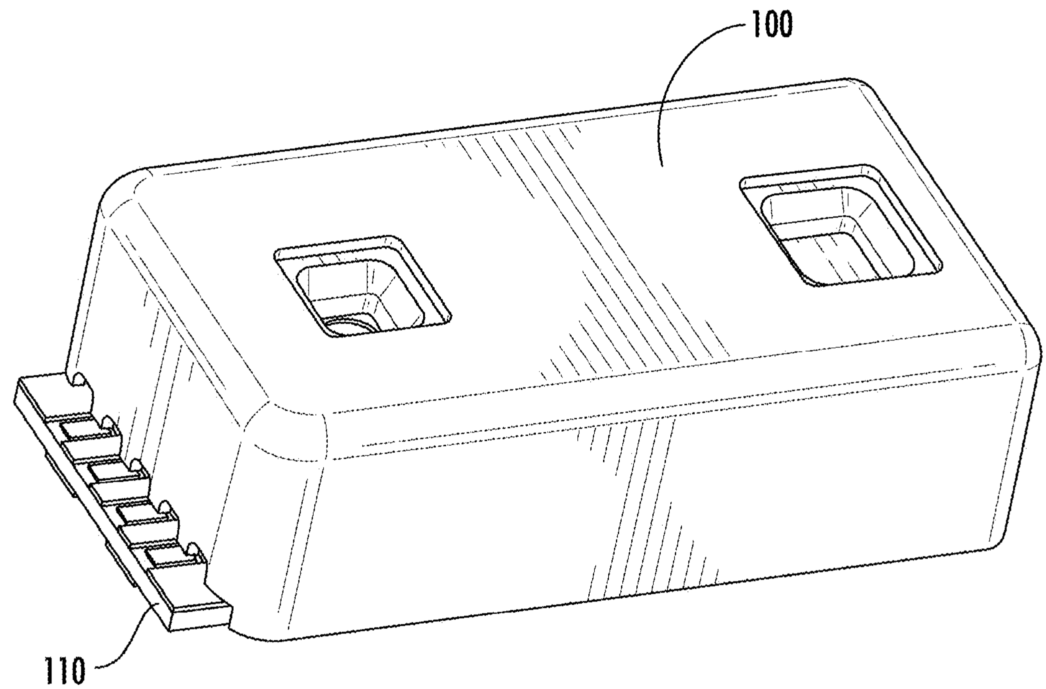
Figure 2:
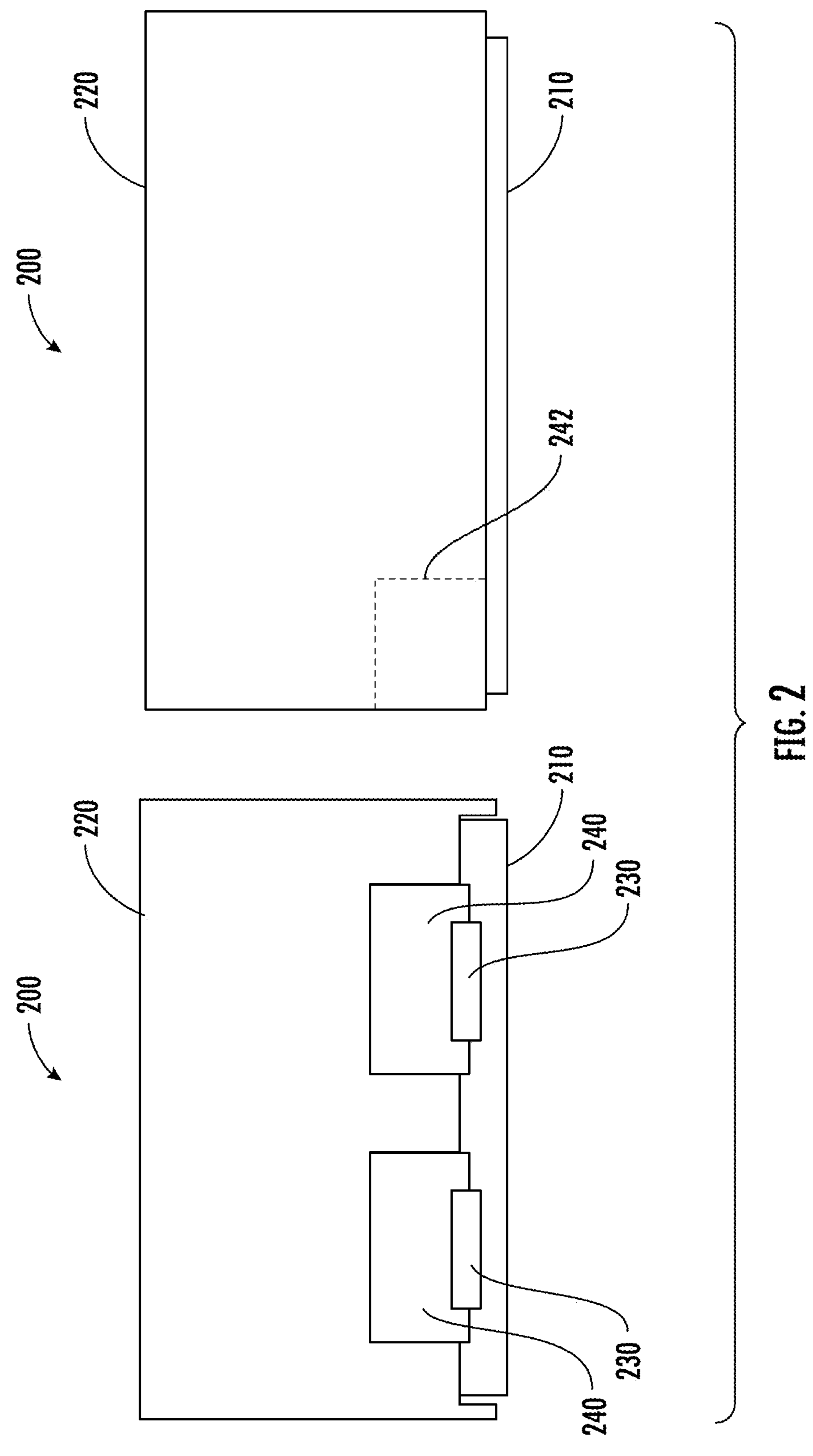
Figure 3:
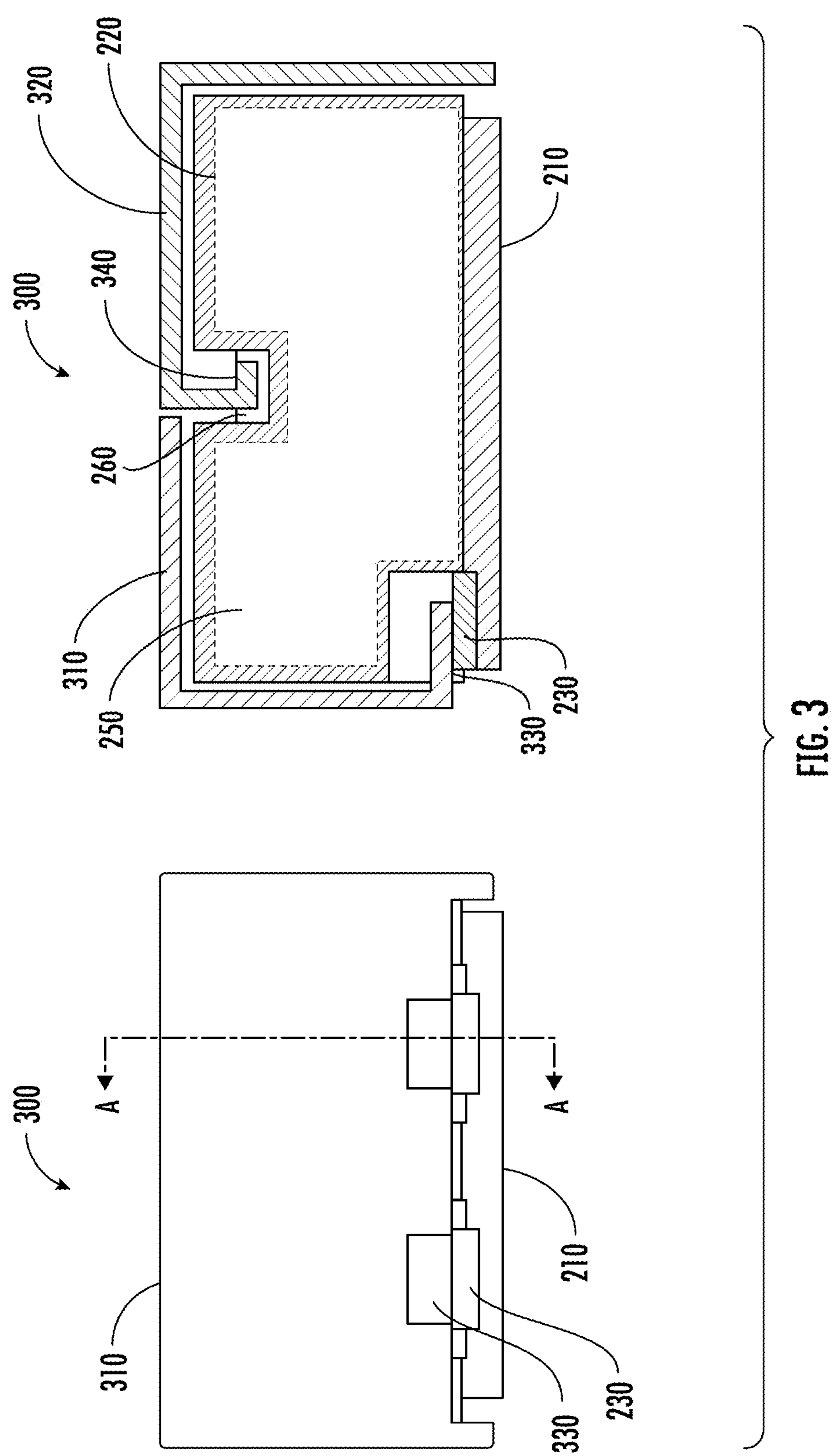
Figure 4:
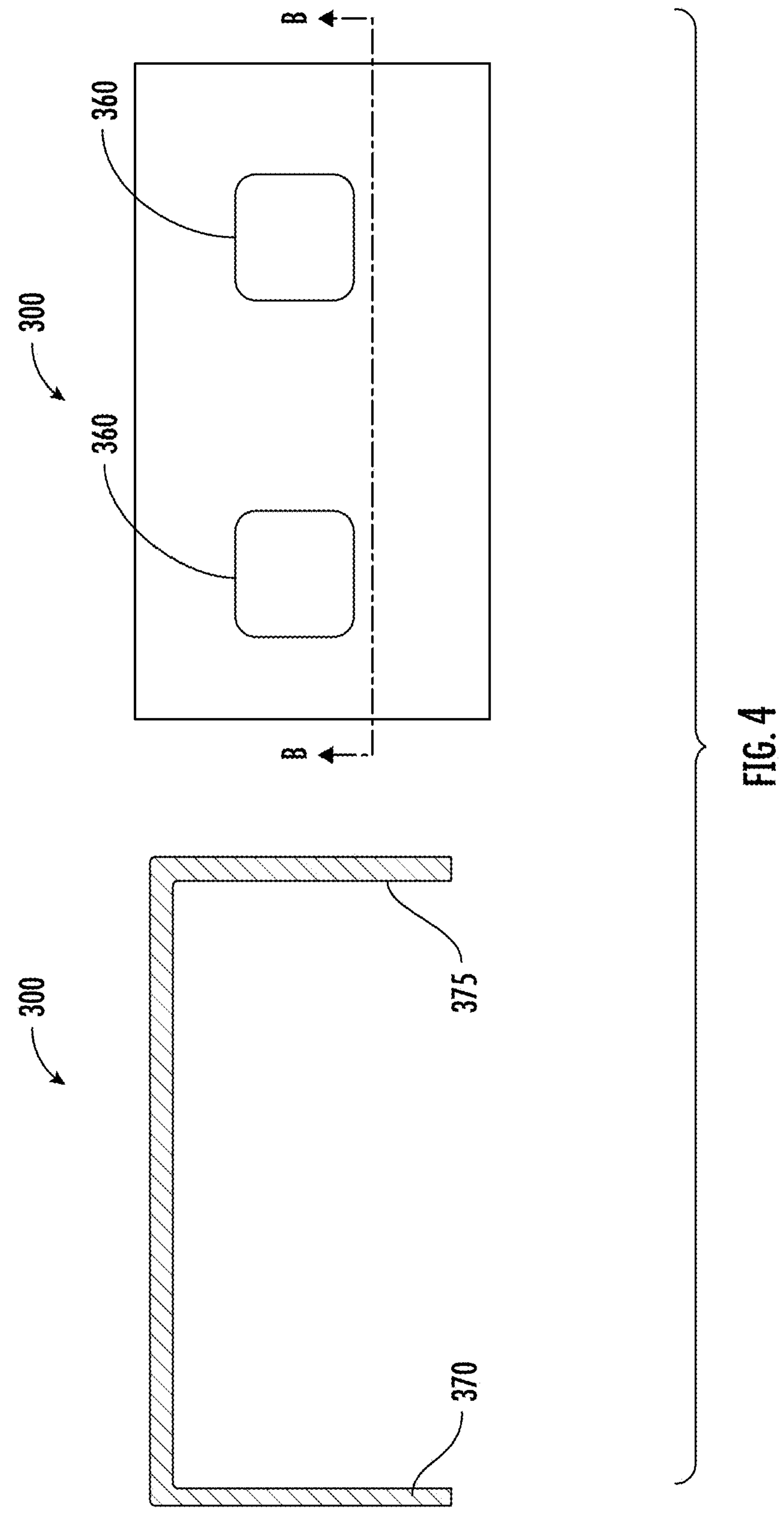
Figure 5:
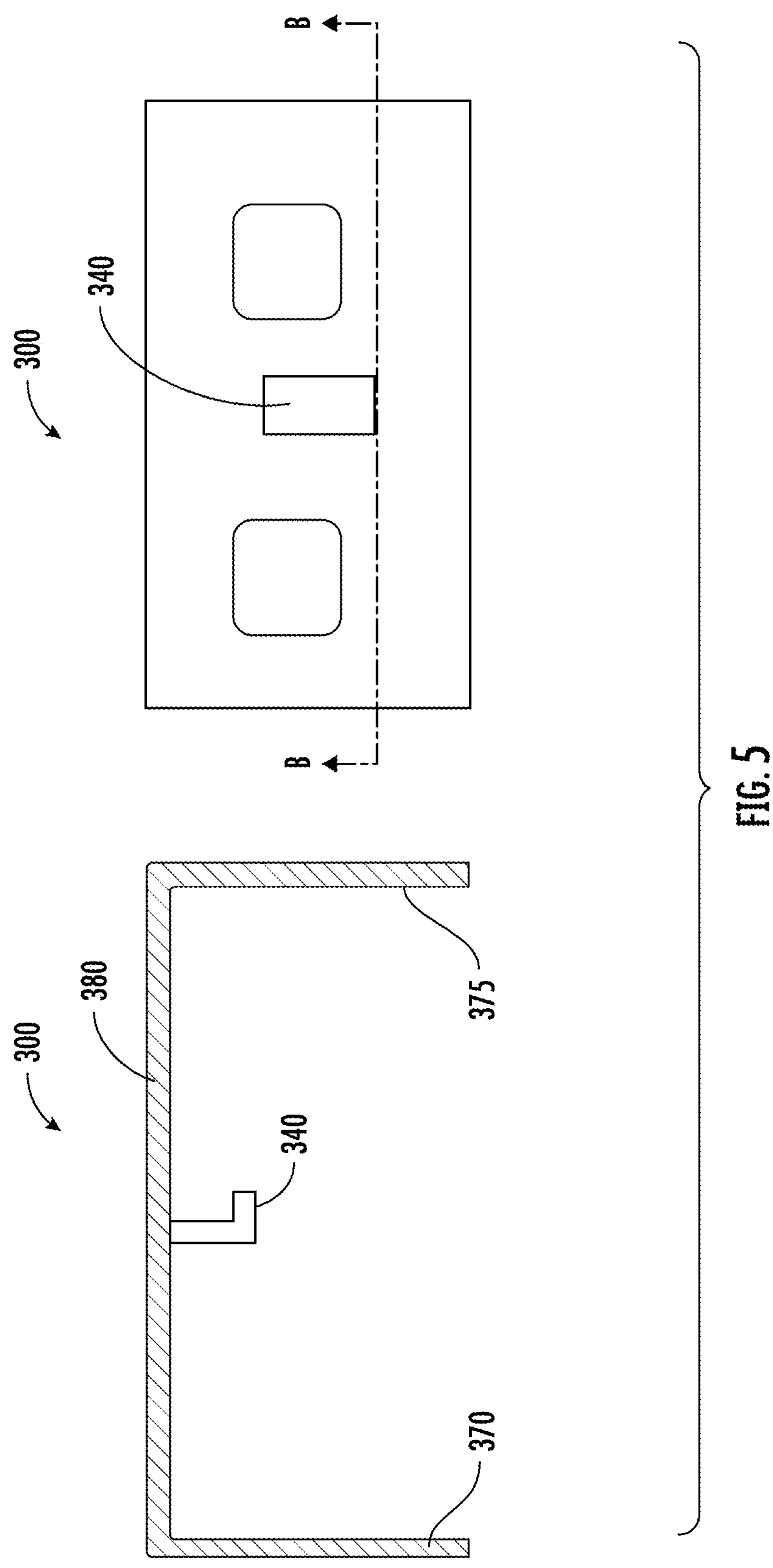
Figure 6:
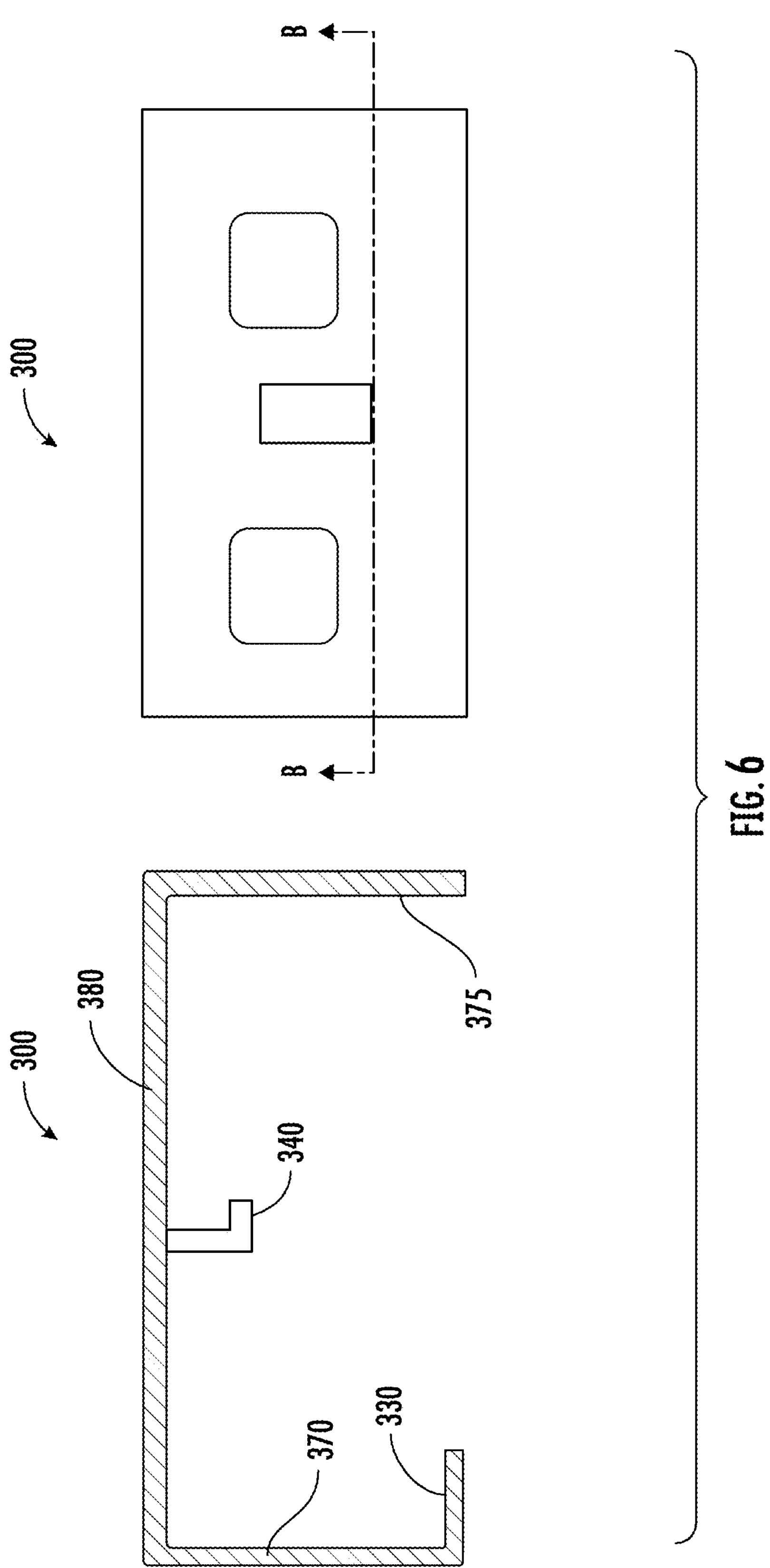
Figure 7:
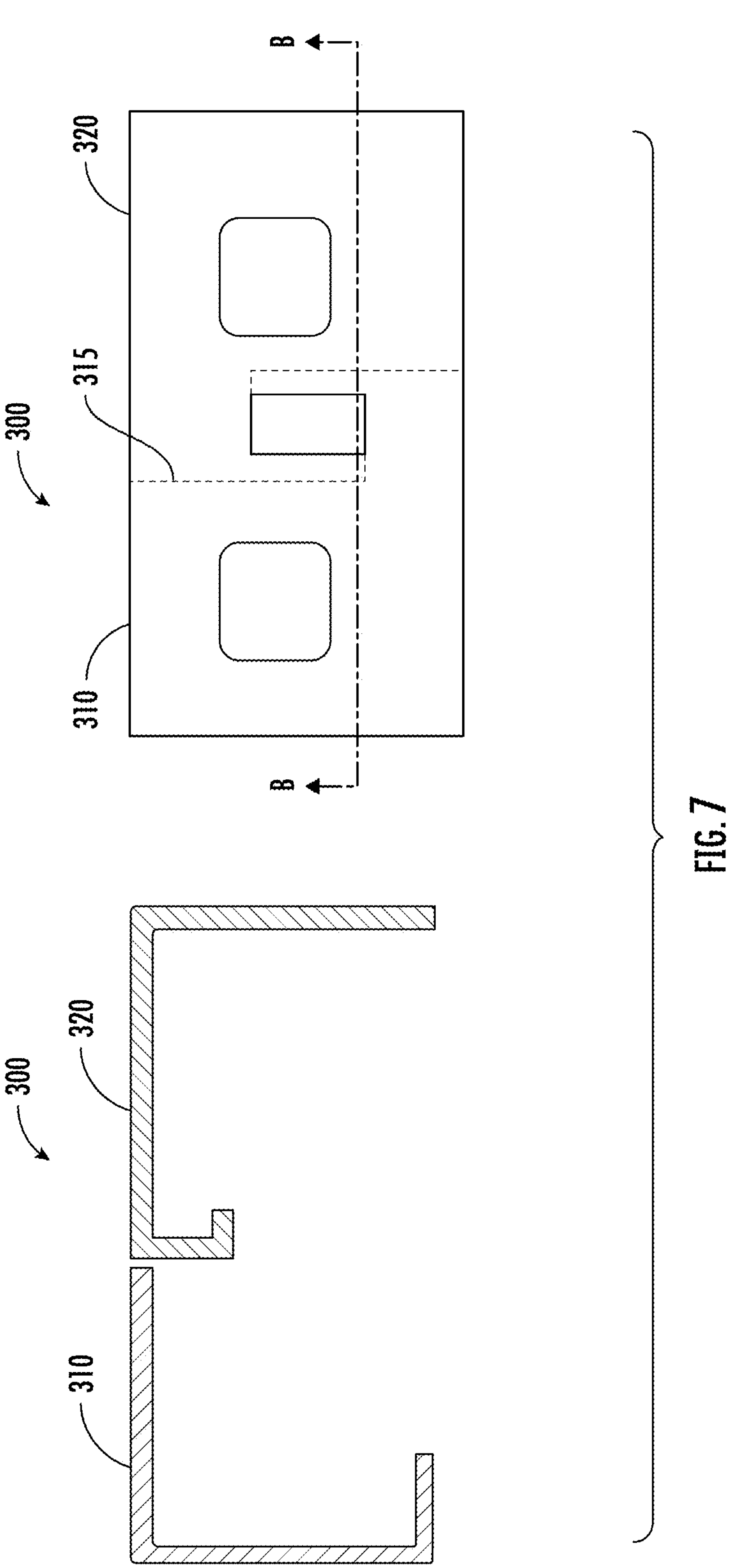
Figure 8:
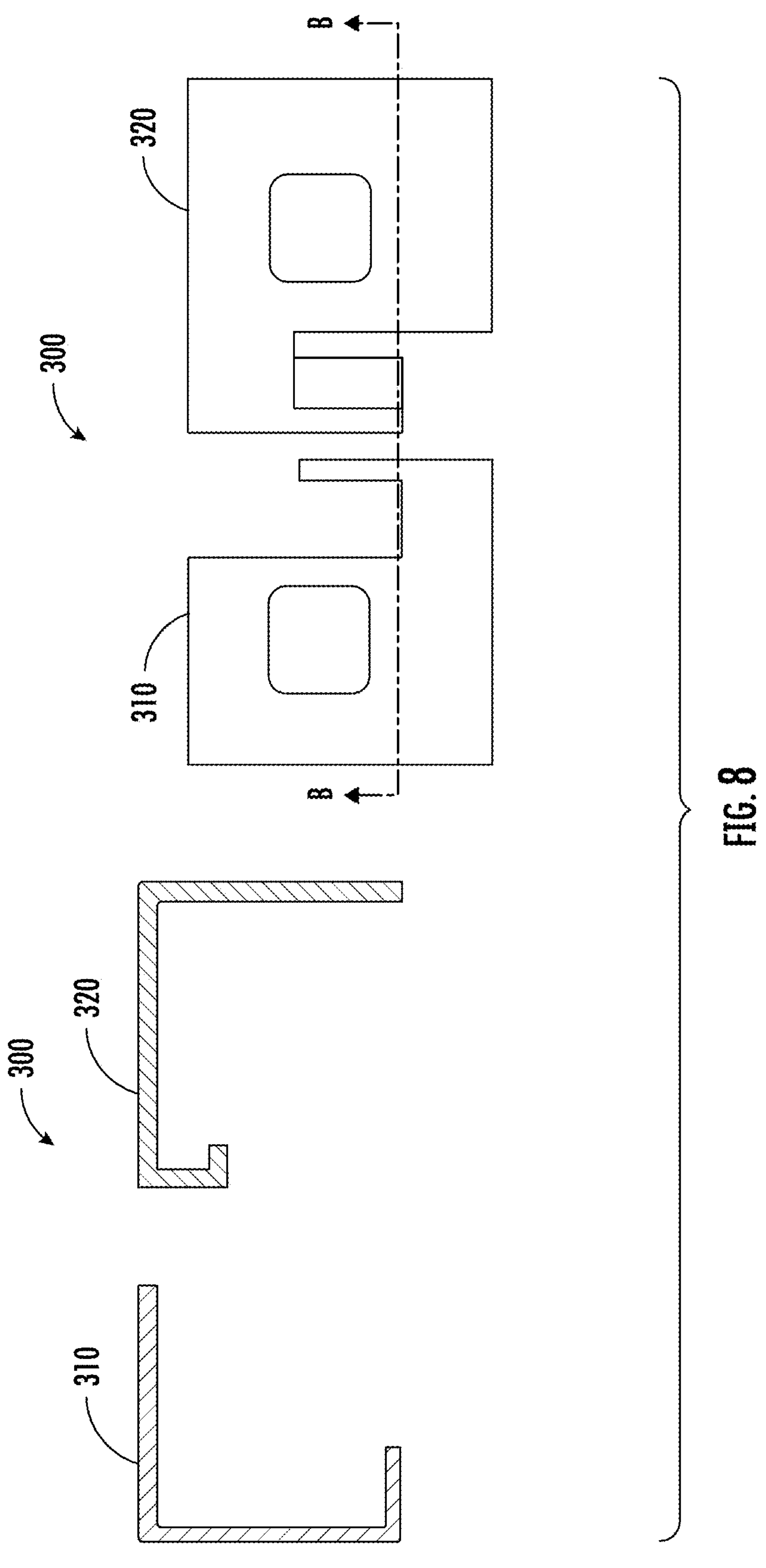
Figure 9:
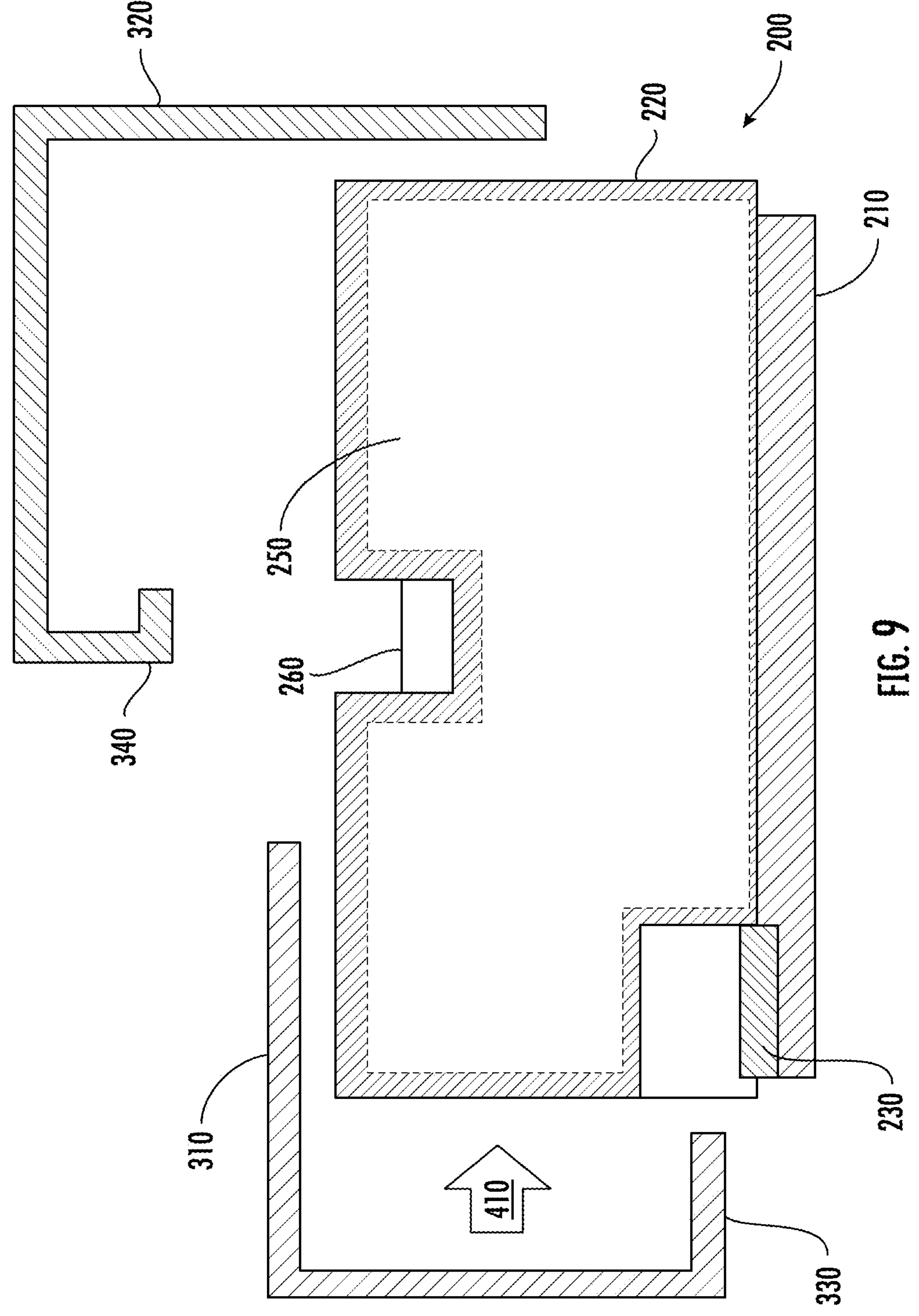
Figure 10:
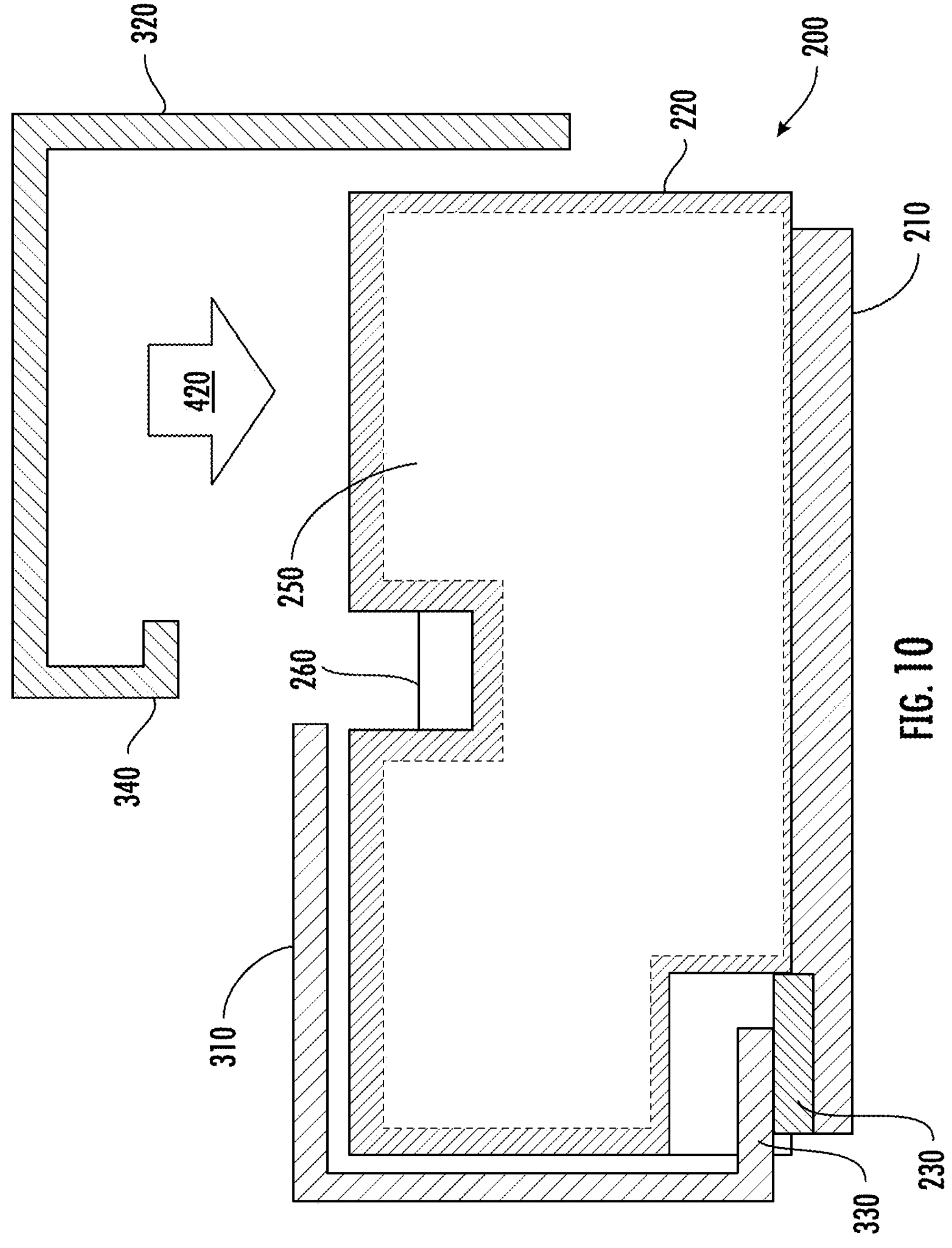
Figure 11:
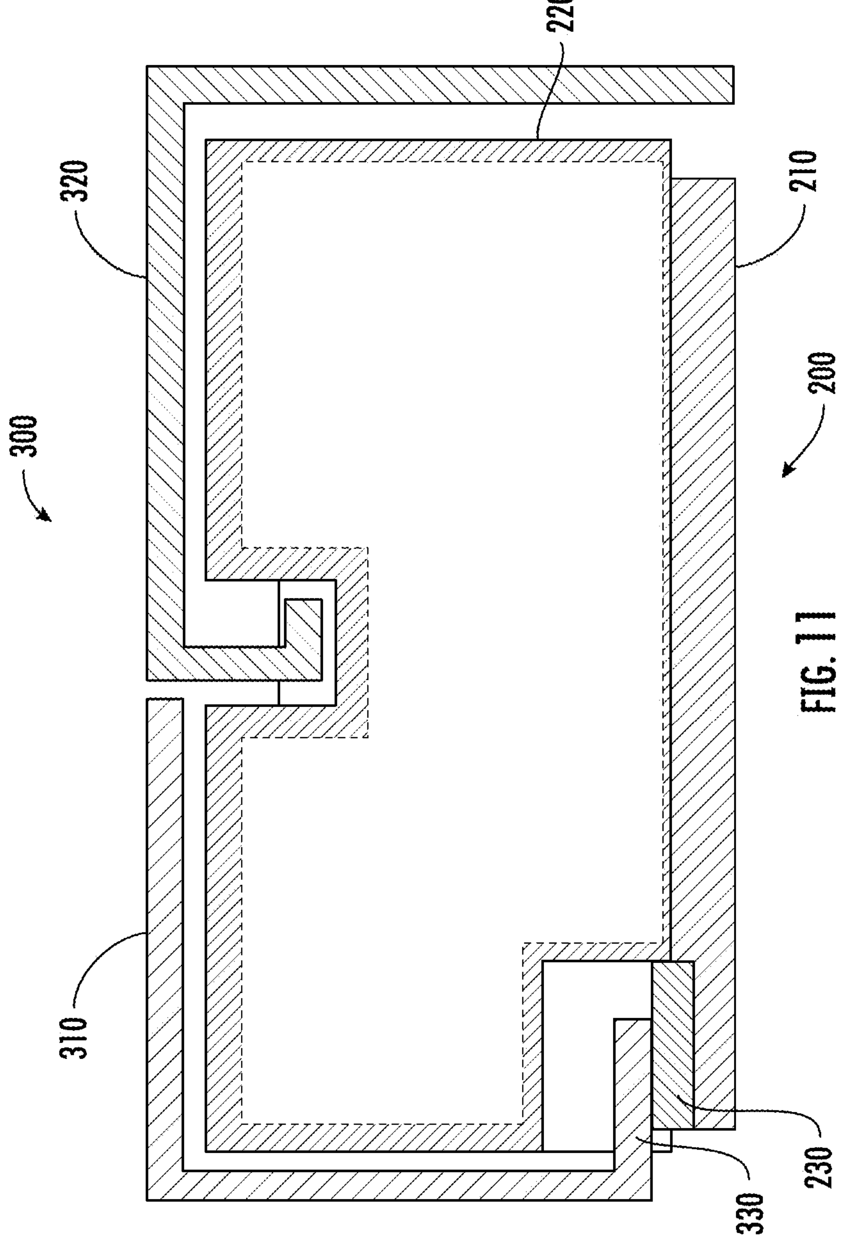
Figure 12:
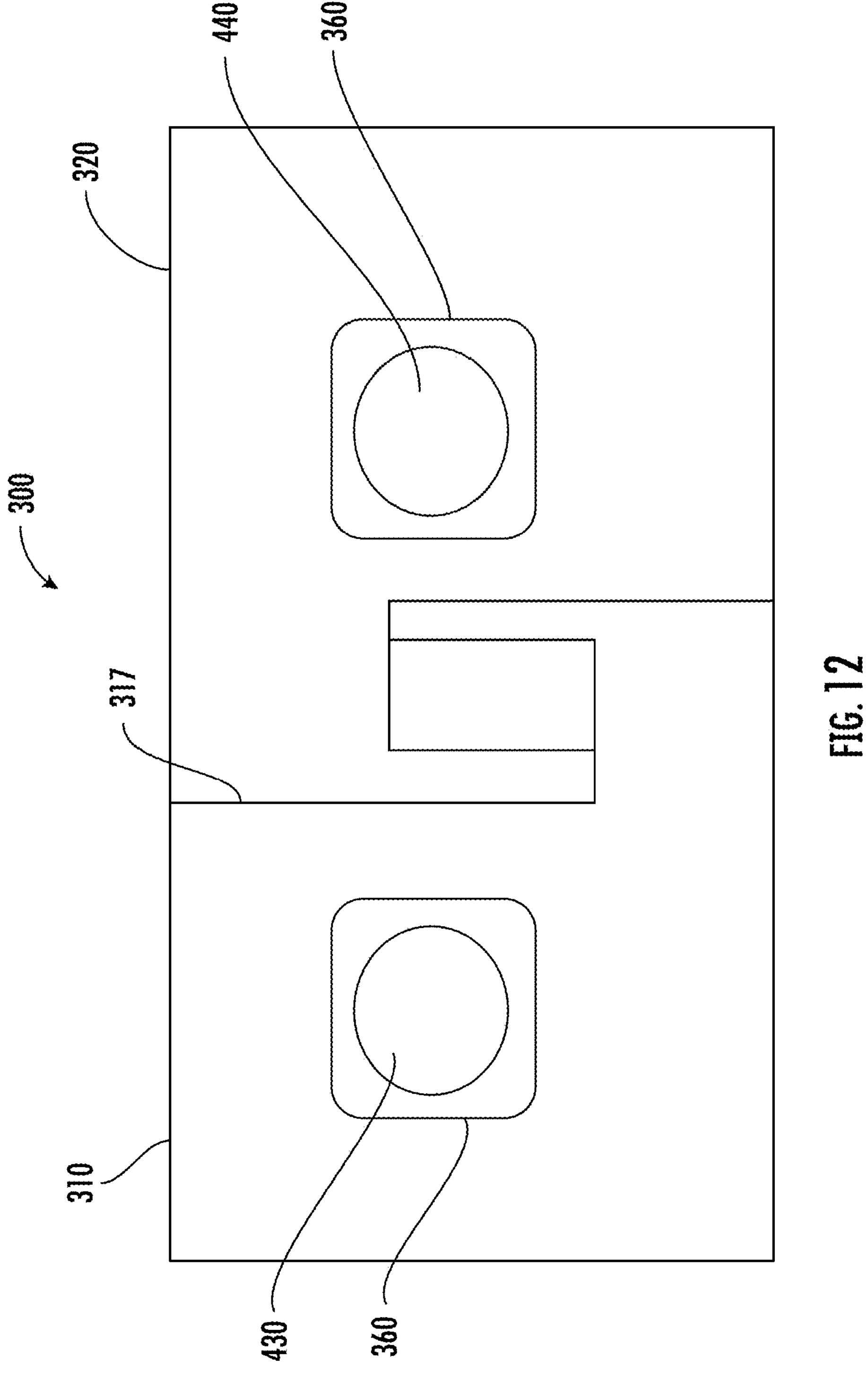
Figure 13:
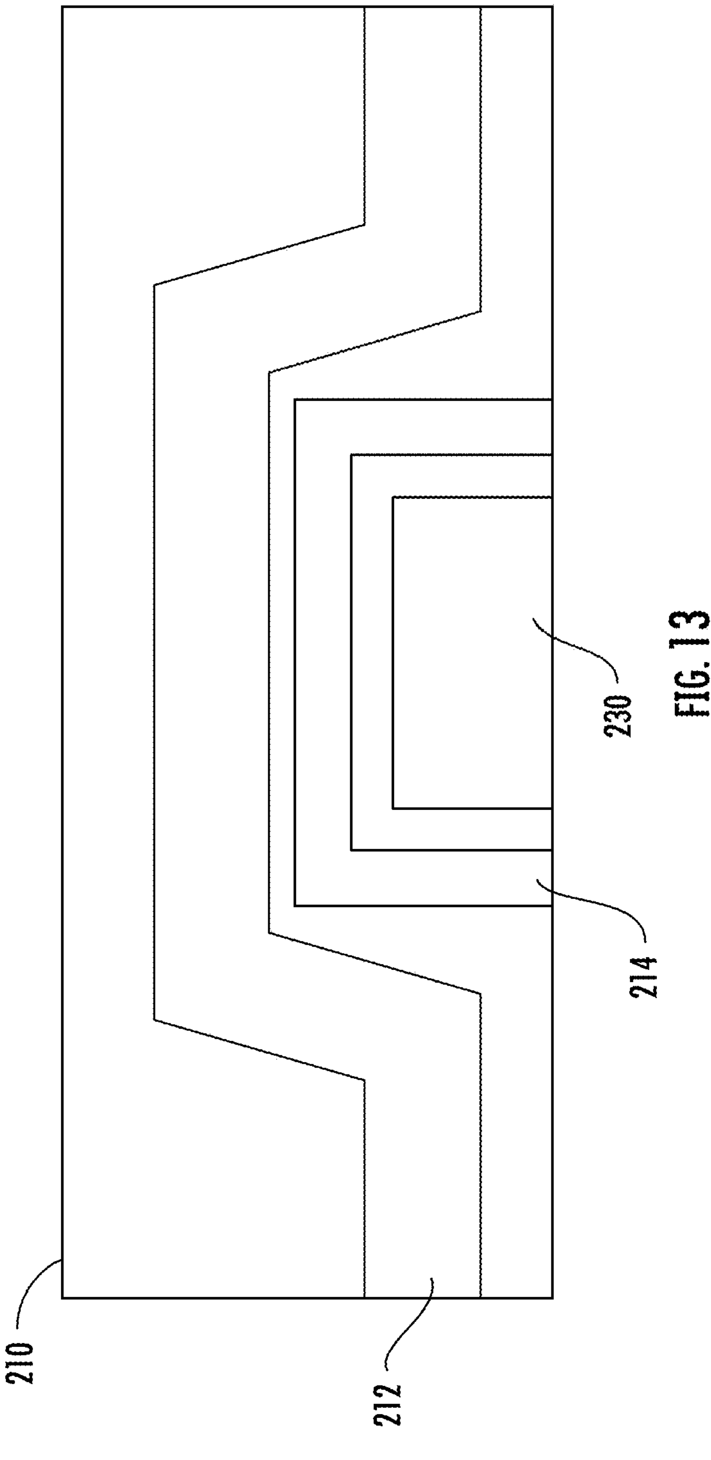
Figure 14:
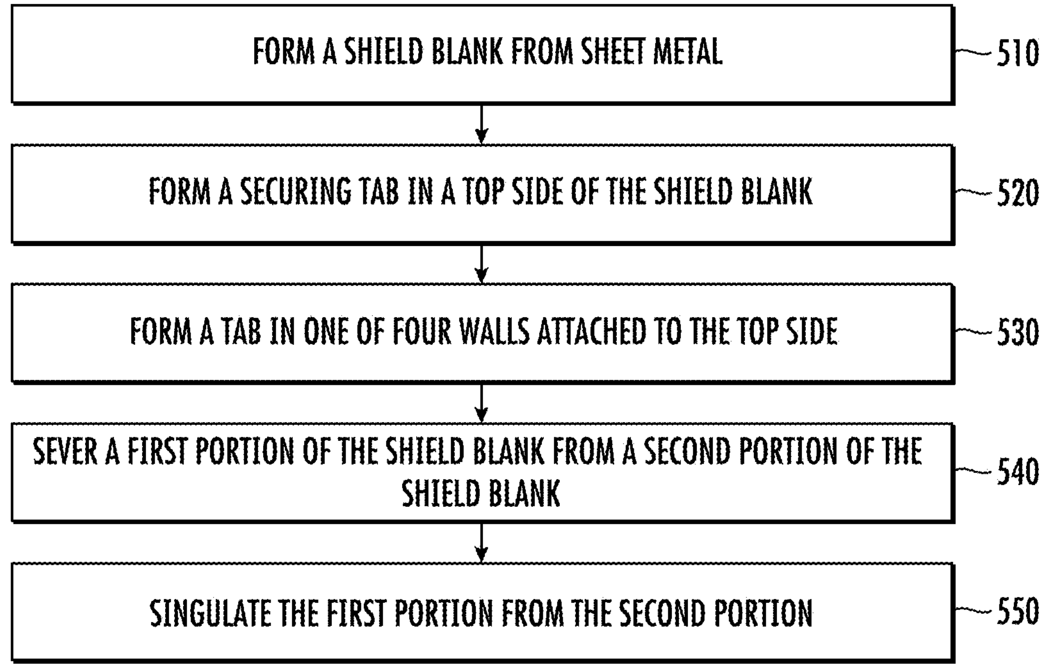

Having thus described certain example embodiments of the present disclosure in general terms, reference will now be made to the accompanying drawings, which are not necessarily drawn to scale, and wherein:

FIG. 1 illustrates a time-of-flight sensor including an external grounding connection according to an example embodiment of the prior art;

FIG. 2 illustrates a device requiring an external metal EMI shield according to example embodiments of the present disclosure;

FIG. 3 illustrates the device of FIG. 2 with external metal EMI shield positioned over the device according to an example embodiment of the present disclosure;

FIG. 4 illustrates an EMI shield blank having apertures formed therein according to an example embodiment of the present disclosure;

FIG. 5 illustrates the EMI shield blank having a securing tab formed therein according to an example embodiment of the present disclosure;

FIG. 6 illustrates the EMI shield blank having a grounding tab formed therein according to an example embodiment of the present disclosure;

FIG. 7 illustrates a cut line forming an interface between a first portion and second portion of a two-piece EMI shield according to an example embodiment of the present disclosure;

FIG. 8 illustrates the EMI shield separated into the first portion and the second portion according to an example embodiment of the present disclosure;

FIG. 9 illustrates assembly of the two-piece EMI shield on a device according to an example embodiment of the present disclosure;

FIG. 10 illustrates the first portion of the two-piece EMI shield attached to the device according to an example embodiment of the present disclosure;

FIG. 11 illustrates the second portion of the two-piece EMI shield attached to the device and secured to the first portion according to an example embodiment of the present disclosure;

FIG. 12 illustrates a top-view of the assembled two-piece EMI shield attached to the device according to an example embodiment of the present disclosure;

FIG. 13 illustrates a portion of a substrate of the device to which a two-piece EMI shield is to be attached according to an example embodiment of the present disclosure; and FIG. 14 is a flowchart of a method of manufacturing a two-piece EMI shield according to an example embodiment of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in various embodiments," "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, communications circuitry, input/output circuitry, and the like. In some embodiments, other elements may provide or supplement the functionality of particular circuitry.

Various embodiments of the present disclosure are directed to improved systems, apparatuses, and methods for an external shield for electromagnetic interference reduction of a sensor, and more particularly, to a two-part external metal shield for electromagnetic interference reduction that reduces vulnerability of the shielded sensor. Certain electronic devices require or otherwise benefit from electromagnetic interference (EMI) shielding to reduce the adverse effects of EMI on the device operation. EMI mitigation and/or reduction is a key design parameter in module design and is generally addressed both mechanically and through design of the device itself (e.g., the device substrate). Mechanically addressing EMI mitigation and reduction can be accomplished using shielding, such as using an external metal shield design which may be referred to as an external metal can in embodiments herein as the external metal can substantially covers the shielded device.

To effectively employ a grounded metal shield, the grounded metal shield described herein is grounded to a device that is being shielded. The device may be a device on a substrate, such as a printed circuit board (PCB) and the grounded metal shield can provide a significant reduction in EMI. Devices such as image sensors or time-of-flight sensors (e.g., Light Distancing and Ranging/LIDAR) can particularly benefit from EMI shielding as described herein. Such devices often are produced on a PCB. However, conventional sensors employing an external metal EMI shield are often vulnerable to damage during handling, shipping, etc. FIG. 1 illustrates a prior art example of a device formed on a PCB having an external metal EMI shield 100. The illustrated embodiment includes an exposed portion of the PCB 110, whereby the EMI shield 100 is soldered to a ground connection of the PCB 110. The exposed portion of the PCB 110 poses a reliability issue for the device as the exposed substrate is unsupported and can be damaged, such as during handling (e.g., packaging, shipping, unpackaging, installation in a device, etc.).

Embodiments provided herein provide a solution that divides the external metal EMI shield into two sections. The first section includes connection points to the substrate that are bent inwards, toward a shielded device to attach to the substrate. The connection points are connected to the substrate with conductive adhesive. The second section of the external metal EMI shield is then attached to the first half of the external metal EMI shield with a locking mechanism that joins the two sides of the shield and the halves are sealed together using a conductive adhesive within a plastic cap of the shielded device.

FIG. 2 illustrates an example embodiment of a device 200 requiring an external metal EMI shield as described herein. The device of the illustrated embodiment can include, for example, an image sensor or time-of-flight (ToF) sensor. As shown in the end view, the device 200 includes a substrate 210 in the form of a printed circuit board and a cap 220, which may be formed of plastic or other non-conductive structural material. Formed within the cap 220 are apertures 240 that expose therethrough connection tabs 230 for the device 200. The connection tabs 230 can include any connection tabs necessary for connecting the device 200 to a device into which the device is installed, but the illustrated embodiments described herein focus on connection tabs 230 for purposes of grounding the device 200 to mitigate EMI. The front view depicts the cap 220 and a dashed-line representation 242 of the apertures 240 formed in the cap 220.

FIG. 3 illustrates an example embodiment of the device 200 of FIG. 2 with external metal EMI shield 300 positioned over the cap according to embodiments described herein. The end view illustrates the first portion 310 of the EMI shield 300, which substantially covers the end of the device as shown. Also visible are the tabs 330 that connect to the connection tabs 230 of the substrate 210 device, such as with conductive adhesive. FIG. 3 also shows a section view taken along section line A-A of the end view in FIG. 3. As shown, the contents 250 of the cap 220 are omitted with the contents shown omitted with dashed lines for ease of understanding. The section view illustrates the first portion 310 and the second portion 320 of the EMI shield 300 as interlocked together.

Also visible in the front section view of FIG. 3 are the bent-in tabs 330 that connect to connection tabs 230 of the substrate 210. The bent-in tabs 330 connect to the connection tabs 230 with conductive adhesive in a manner that they are protected by the device cap 220 and the EMI shield 300. This ability to employ undercutting bent-in tabs 330 to connect and ground the device is a feature of the disclosed embodiments enabled by the two-part configuration of the EMI shield 300 described herein. The finite tolerances between the EMI shield 300 and the cap 220 can be on the order of under 100 microns or less, such that the close fit of a one-piece metal EMI shield would be unable to attach to the device 200 in the manner described herein. The tight tolerances between the device 200 and the EMI shield are necessary for minimizing packaging sizes of the shielded device as space is at a premium in many mobile devices produced today, and particularly those embodied as cell phones.

According to the illustrated embodiment of FIG. 3, the first portion 310 and the second portion 320 of the two-part EMI shield 300 are secured together and secured to the device, as detailed further below. The second portion 320 includes a securing tab 340 that extends below a top surface of the second portion. The first portion 310 includes a first locking profile that mates with a second locking profile of the second portion 320 that is complementary to the first locking profile to secure the portions together. The securing tab 340 is secured to the device 200 through a conductive adhesive 260 received within a cavity of the cap 220 of the device. The production and assembly of the two-part EMI shield of example embodiments is described further below.

The two-part EMI shield described herein is structured and manufactured in such a way as to maintain the necessary tolerances between parts of the EMI shield, but to also maintain tolerances between the EMI shield and the device 200. The two-part EMI shield of example embodiments is configured to extend to cover sides of the substrate 210 to enhance EMI mitigation while also helping to minimize any light leakage into or out of the sensor itself. An example embodiment of the process to manufacture a two-part EMI shield as described herein is provided with illustrations of significant operations of the process. The operations described herein are not all-encompassing as additional or fewer operations may be carried out in some implementations. Further, the operations are not necessarily performed in the order shown herein except where needed to properly produce the two-part EMI shield of the disclosed embodiments.

The two-part EMI shield of example embodiments is generally made of a metal, as the shield provides EMI protection for the device covered by the shield. Metallized substrates are also contemplated by embodiments of the present disclosure, such as a non-metallic substrate that is metal coated or metal impregnated to achieve the EMI shielding functionality. The below-described embodiment can be used with any type of sensor, but is particularly effective at shielding an image sensor or Time of Flight (ToF) sensor from EMI.

FIGS. 4 through 8 illustrate an example process for manufacturing the two-part EMI shield as described herein. While other processes are capable of forming a two-part EMI shield, the process described herein is particularly efficient. FIG. 4 illustrates a top-view of the EMI shield 300 and a section view taken along section line B-B of the top view. The top view also depicts apertures 360 configured for a ToF sensor, where one aperture enables transmission of a signal from the sensor, while the other aperture enables reception of the returning signal. The section view illustrates the profile of the EMI shield 300 defining a cavity and substantially vertical or straight sidewalls 370 and 375. The basic shape of a shield blank for the EMI shield 300 of FIG. 4 can be achieved, such as by stamping a metal sheet. This process can produce a shield blank including a top side and four walls attached to the top side. The top side is visible in FIG. 4 along with the apertures 360. The apertures can be formed from a die-cutting process, which can be incorporated into the stamping process. Alternatively, the apertures 360 can be laser cut through the metal of the EMI shield 300. A stamping of the EMI shield 300 may require trimming of bottoms of the sidewalls 370, 375, which may be achieved by machining on a mill among other possible techniques.

FIG. 5 illustrates the top view and section view B-B upon punching or forming of securing tab 340. This tab may be formed by a die or other forming mechanism to press a portion of the top side 385 of the EMI shield 300. The securing tab 340 can optionally be formed through the stamping process forming the shield blank. The securing tab 340 extends in a direction toward the cavity of the EMI shield 300 as illustrated. FIG. 6 illustrates the formation of the tab 330 in both the top view and section view B-B. This may be performed, for example, by die, brake, press, etc. The tab 330 may be formed at a radius with the sidewall 370 that mitigates stresses and potential breakage of the tab 330 during assembly to the sensor. Multiple tabs may be formed from sidewall 370 depending upon the number of grounding points of the device. The tab or tabs formed are formed in a direction toward a cavity formed by the EMI shield 300. Forming the tabs in this direction helps to achieve the benefit of a grounding connection to a sensor that is more durable and less likely to be damaged during handling. Notably, the securing tab extends into the cavity along one axis, while the one or more tabs extend into the cavity along another axis that is perpendicular to the securing tab axis. This arrangement enables the secure attachment of the EMI shield 300 to the sensor device as described further below.

FIG. 7 illustrates the EMI shield 300 as cut into the two portions including the first portion 310 and the second portion 320. The cutting can be achieved in a number of different ways; however, the cut 315 needs to be both precise and relatively narrow in thickness as the two portions will interface at the cut to define two parts of an interlocking profile. The cut 315 separates the first portion 310 from the second portion 320, thereby forming the two-piece EMI shield 300 as described herein. Once cut, the two portions can be singulated or separated as shown in FIG. 8. Once separated, the two-piece EMI shield is able to be installed over a device as described herein.

FIG. 9 illustrates a cross-section view of an example device 200 including a substrate 210 and a cap 220 covering the various components of the sensor. The sensor contents 250 are omitted and represented by the dashed line surrounding contents 250. The cap includes the recessed connection tabs 230 which are recessed so as not to extend out from under the cap 220 and to avoid the vulnerabilities of a substrate that extends beyond the cap. The cap 220 also includes a recess in a top of the cap configured to receive therein conductive adhesive 260 as shown.

The installation of the two-piece EMI shield as described herein includes attachment of the first portion 310 to the cap 220, by way of inserting the tab(s) 330 into the recess in the cap that includes the connection tabs 230, as shown by arrow 410 along a first axis that is substantially parallel to a plane defined by the sensor substrate. In this way, the tab(s) 330 of the conductive first portion 310 of the EMI shield is secured to the cap 220. The tab(s) 330 of the first portion 310 of the EMI shield can be attached to the connection tabs 230 using, for example, a conductive adhesive to avoid the need for soldering in the confined space formed by the cap 220 and the EMI shield.

The second portion 320 of the EMI shield is installed as shown in FIG. 10, along the path of arrow 420 which is along a second axis that is substantially orthogonal to the plane defined by the sensor substrate. The securing tab 340 of the second portion 320 is received within the recess of the cap 220 containing the conductive adhesive, while the second portion 320 is secured to the first portion 310 based on the locking profile created through the cutting pattern shown in FIG. 7. FIG. 11 illustrates the two-piece EMI shield 300 as attached and secured to the device 200. The EMI shield 300 is conductive, as described above, and may be formed of a metal or metallized material. The connection of the EMI shield 300 to the connection tabs 230 by way of tab(s) 330 grounds the EMI shield, and the connection at the interface between the first portion 310 and the second portion 320 ensures the entire EMI shield 300 is grounded to the connection tabs 230 of the device 200. The second portion 320 is secured in position by the conductive adhesive 260 in the recess on the top surface of the device 200, while the first portion 310 is secured to the device at both the connection tab 230 (e.g., using conductive adhesive) and at the interface with the second portion.

FIG. 12 illustrates a top view of the two-piece EMI shield 300 as secured to the device, where the ToF sensor is visible through the apertures 360 including a transmission element 430 and a reception element 440. The first portion 310 of the EMI shield 300 is secured to the second portion of the EMI shield at the interface 317 between the portions.

The device of example embodiments described herein is specifically configured for attachment of the two-piece EMI shield detailed above. The device includes recesses providing access to connection tabs 230 as described above. As these recesses are formed into the cap of the device, the cap cannot fully cover over the substrate 210 which is often a technique employed to ensure that there is no light leakage from the components of the device to outside of the cap 220. To resolve this possible issue, embodiments described herein adhere the cap 220 to the substrate 210 using an adhesive that floods the area between the cap and the substrate.

FIG. 13 illustrates a portion of the substrate 210 as viewed from above showing the connection tab 230. The cap (not shown) is attached and secured to the substrate 210 using adhesive 212 that is distributed in a pattern around at least a portion of the substrate 210 corresponding to the shape profile of the cap where they attach. As this adhesive may be liberally dispensed to ensure complete attachment and to mitigate light leakage, embodiments described herein employ a dam 214 positioned around the connection tab 230 that precludes adhesive flow onto the connection tab 230 during assembly of the cap to the substrate.

FIG. 9 illustrates an example a flowchart of operations for manufacturing a two-piece EMI shield in accordance with one or more embodiments of the present disclosure. In various embodiments one or more of the operations may be omitted or repeated. It will also be appreciated that other operations not described herein may also occur. According to the illustrated embodiment, a shield blank is formed from sheet metal at 510. This may be performed by, for example, a stamping operation, where the shield blank has a top side and four walls attached to the top side define a cavity of the shield blank. A securing tab is formed within the top side at 520, where the securing tab extends toward the cavity. A tab is formed at 530 in one of the four walls, where the tab extends toward the cavity. The first portion is severed from the second portion at 540 along a cut line. The first portion is singulated from the second portion at 550.

Operations and/or functions of the present disclosure have been described herein, such as in flowcharts or figures associated with flowcharts. While operations and/or functions are illustrated in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this specification contains many specific embodiments and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

While this detailed description has set forth some embodiments of the present invention, the appended claims cover other embodiments of the present invention which differ from the described embodiments according to various modifications and improvements.

Within the appended claims, unless the specific term "means for" or "step for" is used within a given claim, it is not intended that the claim be interpreted under 35 U.S.C. § 112, paragraph 6.

The invention claimed is:

1. An electronic device comprising:
- a sensor substrate;
- a sensor;
- an electromagnetic shield defining a cavity within which the sensor is received;
- a sensor cap attached to the sensor substrate;
- wherein the electromagnetic shield comprises a first portion and a second portion, wherein the first portion comprises one or more tabs extending into the cavity, wherein the first portion comprises a first part of an interfacing profile, the second portion comprises a second part of the interfacing profile, and wherein the first portion is secured to the second portion in response to the first part of the interfacing profile engaging with the second part of the interfacing profile, and
- at least one connecting tab defined on the sensor substrate, wherein at least one recess defined within the sensor cap provides access to the at least one connecting tab, and wherein the one or more tabs of the electromagnetic shield engages the at least one connecting tab within the at least one recess.

2. The electronic device of claim 1, wherein the sensor cap is attached to the sensor substrate using an adhesive, wherein the sensor substrate comprises at least one dam at least partially surrounding the at least one connecting tab, between the adhesive and the at least one connecting tab.

3. The electronic device of claim 1, wherein the first portion is installed onto the sensor along a first axis, substantially parallel to a plane defined by the sensor substrate.

4. The electronic device of claim 3, wherein the second portion is installed onto the sensor along a second axis, orthogonal to the plane defined by the sensor substrate.

5. The electronic device of claim 4, wherein the second portion of the electromagnetic shield comprises a securing tab extending into the cavity defined by the electromagnetic shield, wherein the securing tab is received into a recess in a top surface of the sensor cap.

6. The electronic device of claim 5, wherein the securing tab is secured within the cavity in the recess in the top surface of the sensor cap with a conductive adhesive.

7. The electronic device of claim 1, wherein the first portion and the second portion are formed of electrically conductive material, and wherein the second portion is in electrical communication with the at least one connecting tab through the first portion.

8. The electronic device of claim 1, wherein a clearance between the electromagnetic shield and the sensor is around one hundred microns or less.

9. A electromagnetic shield for a sensor comprising:
- a first portion defining a first part of an interfacing profile and one or more tabs; and
- a second portion defining a second part of the interfacing profile;
- wherein the first portion and the second portion combine to form a cavity into which the sensor is received, wherein the one or more tabs extends into the cavity along a first axis, and wherein the first part of the interfacing profile is secured to the second part of the interfacing profile along a second axis perpendicular to the first axis,
- wherein the first portion defines a first aperture for a receiving element of a time-of-flight sensor, and wherein the second portion defines a second aperture for a transmitting element of the time-of-flight sensor.

10. The electromagnetic shield of claim 9, wherein the second portion further defines a securing portion extending into the cavity along the second axis.

11. The electromagnetic shield of claim 10, wherein the first portion and the second portion are formed of conductive material, and wherein the first portion is in electrical communication with the second portion through the interfacing profile.

12. The electromagnetic shield of claim 11, wherein the first portion and the second portion are formed of metal.

13. An electronic device comprising:
- a sensor substrate;
- a sensor disposed on a first side of the sensor substrate; and
- an electromagnetic shield covering over at least a portion of the first side of the sensor substrate, the electromagnetic shield defining a cavity within which the sensor is received;
- wherein the electromagnetic shield comprises a first portion and a second portion, wherein the second portion comprises a securing tab extending into the cavity, wherein the securing tab extends into the cavity toward the first side of the sensor substrate, orthogonal to a plane of the sensor substrate, wherein the first portion comprises a first part of an interfacing profile, the second portion comprises a second part of the interfacing profile, and wherein the first portion is secured to the second portion in response to the first part of the interfacing profile engaging with the second part of the interfacing profile.

14. The electronic device of claim 13, wherein the sensor comprises:

a sensor cap attached to the sensor substrate; and at least one connecting tab defined on the sensor substrate, wherein at least one recess defined within the sensor cap provides access to the at least one connecting tab, and wherein one or more tabs of the electromagnetic shield engages the at least one connecting tab within the at least one recess.

15. The electronic device of claim 14, wherein the sensor cap is attached to the sensor substrate using an adhesive, wherein the sensor substrate comprises at least one dam at least partially surrounding the at least one connecting tab, between the adhesive and the at least one connecting tab.

16. The electronic device of claim 14, wherein the first portion is installed onto the sensor along a first axis, substantially parallel to a plane defined by the sensor substrate.

17. The electronic device of claim 16, wherein the second portion is installed onto the sensor along a second axis, orthogonal to the plane defined by the sensor substrate.

18. The electronic device of claim 17, wherein the securing tab is received into a recess in a top surface of the sensor cap.

19. The electronic device of claim 18, wherein the securing tab is secured within the cavity in the recess in the top surface of the sensor cap with a conductive adhesive.

20. The electronic device of claim 14, wherein the first portion and the second portion are formed of electrically conductive material, and wherein the second portion is in electrical communication with the at least one connecting tab through the first portion.

* * * * *